(12) United States Patent
Zhang

(10) Patent No.: US 9,641,196 B2
(45) Date of Patent: May 2, 2017

(54) DATA BLOCK INTERLEAVING AND DEINTERLEAVING METHOD AND APPARATUS FOR COMMUNICATION EQUIPMENTS

(71) Applicant: HI-TREND TECHNOLOGY (SHANGHAI) CO., LTD., Shanghai (CN)

(72) Inventor: Xuming Zhang, Irvine, CA (US)

(73) Assignee: Hi-Trend Technology (Shanghai) Co., Ltd., Shanghai (CN)

( * ) Notice: Subject to any disclaimer, the term of this patent is extended or adjusted under 35 U.S.C. 154(b) by 179 days.

(21) Appl. No.: 14/596,709

(22) Filed: Jan. 14, 2015

(65) Prior Publication Data

US 2015/0263765 A1  Sep. 17, 2015

(30) Foreign Application Priority Data

Mar. 13, 2014  (CN) .......................... 2014 1 0093531

(51) Int. Cl.
 *H03M 13/27*  (2006.01)
(52) U.S. Cl.
 CPC ....... *H03M 13/276* (2013.01); *H03M 13/275* (2013.01)
(58) Field of Classification Search
 CPC .......................... H03M 13/276; H03M 13/275
 USPC ................ 714/701, 800, 776, 762
 See application file for complete search history.

(56) References Cited

U.S. PATENT DOCUMENTS

| | | | | |
|---|---|---|---|---|
| 2002/0181569 A1* | 12/2002 | Goldstein | .......... | H03M 13/1148 375/222 |
| 2003/0221157 A1* | 11/2003 | Becker | .............. | H03M 13/2714 714/756 |
| 2008/0270876 A1* | 10/2008 | Yokokawa | .......... | G06F 11/1008 714/800 |
| 2009/0213954 A1* | 8/2009 | Bursalioglu | .......... | H04L 1/0631 375/262 |
| 2009/0296842 A1* | 12/2009 | Papadopoulos | ... | H04L 25/03216 375/260 |
| 2010/0111232 A1* | 5/2010 | Papadopoulos | ..... | H04L 27/2647 375/340 |
| 2011/0029845 A1* | 2/2011 | Zhou | .................. | H03M 13/1171 714/776 |
| 2015/0188734 A1* | 7/2015 | Petrov | .................. | H03M 13/116 375/260 |

(Continued)

OTHER PUBLICATIONS

J. Hirsch, "Performance of open-standard PLC technologies on ERDF distribution network," ERDF: Électricité Réseau Distribution France, Oct. 2009, 21 pages.

(Continued)

*Primary Examiner* — John J Tabone, Jr.
(74) *Attorney, Agent, or Firm* — Hamre, Schumann, Mueller & Larson, P.C.

(57) ABSTRACT

The present invention relates to communication field, disclosing a data block interleaving and deinterleaving method and apparatus for communication equipments. In the present invention, a recursive method for calculating interleaver or deinterleaver addresses for existing power line communication standards is proposed. The complex modulo operation is simplified to a series of Add-Compare-Subtract operations. Therefore, the hardware implementation complexity is significantly reduced.

14 Claims, 7 Drawing Sheets

(56) References Cited

U.S. PATENT DOCUMENTS

2015/0200747 A1\* 7/2015 Petrov ................... H03M 13/19
714/776

OTHER PUBLICATIONS

"Narrowband orthogonal frequency division multiplexing power line communication transceivers for G3-PLC networks," ITU G.9903, Telecommunication Standardization Sector of International Telecommunication Union, Oct. 2012, 186 pages.

"Narrowband orthogonal frequency division multiplexing power line communication transceivers for ITU-T G.hnem networks," ITU G.9902, Telecommunication Standardization Sector of International Telecommunication Union, Oct. 2012, 170 pages.

"Lower layer profile using OFDM modulation Type 2," (a merged document of "PLC G3 Physical Layer Specification" and "PLC G3 MAC Layer Specification"), ERDF: Électricité Réseau Distribution France, 2011, 144 pages.

"IEEE P1901.2™/D0.06.03 Draft Standard for Low Frequency (less than 500 kHz) Narrow Band Power Line Communications for Smart Grid Applications," Institute of Electrical and Electronics Engineers, Inc., 2012, 295 pages.

\* cited by examiner

DATA BLOCK INTERLEAVING AND DEINTERLEAVING METHOD AND APPARATUS FOR COMMUNICATION EQUIPMENTS

TECHNICAL FIELD

The present invention relates to communication field, especially relates to data block interleaving and deinterleaving technologies for communication equipments.

BACKGROUND

In the time-varying channel of land mobile telecommunication, bit errors often occur in burst. This is due to the fact that a burst of successive bits may be corrupted by a long lasting deep fade. However, only random errors or a short error burst can be effectively corrected by common forward error control (FEC) coding techniques. To solve this problem, a method that spreads FEC coded bits of a message over a long packet is desired, that is, successive (coded) bits of a message are sent in a non-successive way. In this way, even though a burst of bit errors occurs in the communications process, they shall be de-spread at the receiver to a more random error pattern such that the random errors are readily corrected by error correction function, and the original message is recovered. This method is interleaving technology.

ITU G.9902, ITU G.9903, IEEE P1901.2, and G3-PLC are Power Line Communication (PLC) international standards based on Orthogonal Frequency Division Multiplexing (referred to as "OFDM"), wherein a design of Forward Error Control (referred to as "FEC") interleaver that is used can provide protection against following two different sources of errors:

Several consecutive OFDM symbol errors (time domain) caused by strong impulsive interference;

Several consecutive OFDM subcarrier errors (frequency domain) caused by strong frequency selective fading or narrow-band interference.

In order to improve robustness of the PLC communications, repetition code is often used in the above PLC standards. Interleaving is done after the repetition and copying process, intended to fight both above problems at the same time, providing diversity gain in both the time domain and the frequency domain. Given the number of effective subcarriers (m), the bits to be interleaved are arranged into an n-by-m matrix by a channel interleaver, where n is the number of the OFDM symbols. Interleaving is done in two steps. In the first step, each column of the interleaving matrix is circularly shifted a different number of locations to prevent a whole column data corrupted by strong frequency selective fade or narrow-band interference. In the second step, each row of the interleaving matrix is circularly shifted a different number of locations. Therefore, corrupted OFDM symbols are spread over different symbols. The total number of circular shifts is determined by the parameters $m_i$, $m_j$, $n_i$ and $n_j$, which are selected based on the number of subcarriers in each OFDM symbol (m) as well as the number of the OFDM symbols (n).

FIG. 1 shows bits arrangement of original permutation matrix in a buffer of the interleaver using above standards. Wherein, original bit position in the original permutation matrix is (i, j), where, i=0, 1, . . . , m−1, j=0, 1, . . . , n−1. Interleaved bit position in the permutation matrix is (I, J), and the relationship between the two bit positions is as the following formula:

$$I=(i \cdot m_i + J \cdot m_j) \bmod m$$

$$J=(j \cdot n_j + i \cdot n_i) \bmod n$$

where $(m_i, m_j)$ and $(n_i, n_j)$ are selected as the following formula:

$$GCD(m_i,m)=GCD(m_j,m)=GCD(n_i,n)=GCD(n_j,n)=1$$

where GCD(a, b) indicates the greatest common divisor of two positive integers, a and b. A good set of above parameters can be found based on the following two parameters m and n by performing a simple search and communication protocol or standard will set the rule of generating these parameters. Wherein, m is the number of subcarriers comprised in each OFDM symbol, n is the number of OFDM symbols comprised in the interleaving data block.

Both ITU G.9902 and G3-PLC standards propose a look-up table (LUT) method to implement the double-circular permutation interleaving procedure. However, for G3-PLC interleaver, the range of allowable frame lengths (K=n*m) can be quite large, and furthermore, the LUT size depends on n and m which are unknown to the receiver, therefore the interleaving table must be generated on-the-fly after an FCH (frame control header, referred to as "FCH") has been received. Therefore, the straightforward LUT approach not only requires a large amount of memory space for interleaving tables but also wastes unnecessary computational complexities.

Research background relating to the present invention can specifically refer to the following materials:

1. G3-PLC Physical Layer Specification, ERDF (Electricite Reseau Distribution France), August 2009;

2. Low Frequency (less than 500 kHz) Narrowband Power Line Communications for Smart Grid Applications, IEEE P1901.2 standard, August 2013;

3. Narrowband orthogonal frequency division multiplexing power line communication transceivers for ITU-T G.hnem networks, ITU G.9902 standard, October 2012;

4. Narrowband orthogonal frequency division multiplexing power line communication transceivers for G3-PLC networks, ITU G.9903 standard, October 2012.

SUMMARY OF THE INVENTION

The purpose of the present invention is to provide a data block interleaving and deinterleaving method and apparatus for communication equipments. The original modulo operation is simplified to addition at first, and then comparison, and no more than twice subtraction operation at last in the form of iteration, when computing correspondence between the data before and after interleaving or deinterleaving. Thus, the multiplication of existing algorithms is replaced by an addition operation, and the modulo operation is replaced by a conditional subtraction, so that the hardware implementation complexity is significantly reduced in terms of memory space, hardware silicon area and clock speed requirements.

To solve the above technical problems, one embodiment of the present invention discloses a data block interleaving method for communication equipments, including the following steps:

obtaining an original permutation matrix before the permutation matrix is interleaved;

interleaving the original permutation matrix, wherein, the relationship between a position coordinate (i, j) of any one bit in the original permutation matrix and a position coordinate (I, J) of the bit in the interleaved permutation matrix is:

if I=0, then $$i(0, J) = (i(m-1, J-1) + m_J) \mod m$$

$$j(0, J) = \begin{cases} (j(m-1, J-1) + \tilde{n}_J + n_q) \mod n, & \text{if } i(m-1, J-1) + m_J \geq m \\ (j(m-1, J-1) + \tilde{n}_J) \mod n, & \text{if } i(m-1, J-1) + m_J < m, \end{cases}$$

if I≠0, then $$i(I, J) = (i(I-1, J) + m_I) \mod m,$$

$$j(I, J) = \begin{cases} (j(I-1, J-1) + \tilde{n}_I + n_q) \mod n, & \text{if } i(I-1, J) + m_I \geq m \\ (j(I-1, J-1) + \tilde{n}_I) \mod n, & \text{if } i(I-1, J) + m_I < m, \end{cases}$$

where, i(I, J) is a row coordinate in the original permutation matrix of the bit that has a position coordinate (I, J) in the interleaved permutation matrix, j(I, J) is a column coordinate in the original permutation matrix of the bit that has a position coordinate (I, J) in the interleaved permutation matrix, i=0, 1, . . . , m−1, j=0, 1, . . . , n−1, I=0, 1, . . . , m−1, J=0, 1, . . . , n−1, m and n are the number of columns and the number of rows of the original permutation matrix respectively, mod indicates a modulo operation, and $m_I$, $m_J$, $n_I$ and $n_J$ are derived from by the following formulas:

$$m_I = m_i^{-1} \mod m$$

$$m_J = ((m - m_j) \times m_I) \mod m$$

$$n_I = ((n - n_j) \times n_J) \mod n$$

$$n_J = n_j^{-1} \mod n$$

where, $m_i$ and $m_j$ are designated positive integers which are relatively prime with m, $n_j$ is a designated positive integer which is relatively prime with n, $m_i^{-1}$ is the reciprocal of $m_i$ when $m_i \mod m$, $n_j^{-1}$ is the reciprocal of $n_j$ when $n_j \mod n$, and $m_i^{-1}$ and $n_j^i$ are derived from the following formulas, respectively:

$$(m_i m_i^{-1}) \mod m = 1$$

$$(n_j n_j^{-1}) \mod n = 1$$

and $\tilde{n}_I$, $\tilde{n}_J$ and $n_q$ are derived from the following formulas, respectively:

$$\tilde{n}_I = (m_I n_I) \mod n$$

$$\tilde{n}_J = (m_J n_I + n_J) \mod n$$

$$n_q = (m \times (n - n_I)) \mod n;$$

outputting the interleaved permutation matrix.

Another embodiment of the present invention also discloses a data block deinterleaving method for communication equipments, including the following steps:

obtaining an interleaved permutation matrix;

deinterleaving the interleaved permutation matrix, wherein, the relationship between a position coordinate (I, J) of any one bit in the interleaved permutation matrix and a position coordinate (i', j') of the bit in the deinterleaved permutation matrix is:

if I=0, then $$i'(0, J) = (i'(m-1, J-1) + m_J) \mod m$$

$$j'(0, J) = \begin{cases} (j'(m-1, J-1) + \tilde{n}_J + n_q) \mod n, & \text{if } i'(m-1, J-1) + m_J \geq m \\ (j'(m-1, J-1) + \tilde{n}_J) \mod n, & \text{if } i'(m-1, J-1) + m_J < m, \end{cases}$$

If I≠0, then $$i'(I, J) = (i'(I-1, J-1) + m_I) \mod m$$

$$j'(I, J) = \begin{cases} (j'(I-1, J-1) + \tilde{n}_I + n_q) \mod n, & \text{if } i'(I-1, J) + m_I \geq m \\ (j'(I-1, J-1) + \tilde{n}_I) \mod n, & \text{if } i'(I-1, J) + m_I < m, \end{cases}$$

where, i'(I, J) is a row coordinate in the deinterleaved permutation matrix of the bit that has a position coordinate (I, J) in the interleaved permutation matrix, j'(I, J) is a column coordinate in the deinterleaved permutation matrix of the bit that has a position coordinate (I, J) in the interleaved permutation matrix, i'=0, 1, . . . , m−1, f=0, 1, . . . , n−1, I=0, 1, . . . , m−1, J=0, 1, . . . , n−1, m and n are the number of columns and the number of rows of the original permutation matrix respectively, mod indicates a modulo operation, and $m_I$, $m_J$, $n_I$ and $n_J$ are derived from the following formulas:

$$m_I = m_{i'}^{-1} \mod m$$

$$m_J = ((m - m_{j'}) \times m_I) \mod m$$

$$n_I = ((n - n_{j'}) \times n_J) \mod n$$

$$n_J = n_{j'}^{-1} \mod n$$

where, $m_{i'}$ and $m_{j'}$ are designated positive integers which are relatively prime with m, $n_{j'}$ is a designated positive integer which is relatively prime with n, $m_{i'}^{-1}$ is the reciprocal of $m_{i'}$ when $m_{i'} \mod m$, $n_{j'}^{-1}$ is the reciprocal of $n_{j'}$ when $n_{j'} \mod n$, and $m_{i'}^{-1}$ and $n_{j'}^{-1}$ are derived from the following formulas respectively:

$$(m_i m_i^{-1}) \mod m = 1$$

$$(n_j n_j^{-1}) \mod n = 1$$

and $\tilde{n}_I$, $\tilde{n}_J$, and $n_q$ are derived from the following formulas respectively:

$$\tilde{n}_I = (m_I n_I) \mod n$$

$$\tilde{n}_J = (m_J n_I + n_J) \mod n$$

$$n_q = (m \times (n - n_I)) \mod n;$$

outputting the deinterleaved permutation matrix.

Another embodiment of the present invention also discloses a data block interleaving apparatus for communication equipments, including the following units:

a first obtaining unit configured to obtain an original permutation matrix before the permutation matrix is interleaved;

an interleaving unit configured to interleave the original permutation matrix, wherein, the relationship between a position coordinate (i, j) of any one bit in the original permutation matrix and a position coordinate (I, J) of the bit in the interleaved permutation matrix is:

if I=0, then $$i(0, J) = (i(m-1, J-1) + m_J) \bmod m$$

$$j(0, J) = \begin{cases} (j(m-1, J-1) + \tilde{n}_J + n_q) \bmod n, & \text{if } i(m-1, J-1) + m_J \geq m \\ (j(m-1, J-1) + \tilde{n}_J) \bmod n, & \text{if } i(m-1, J-1) + m_J < m, \end{cases}$$

if I≠0, then $$i(I, J) = (i(I-1, J) + m_I) \bmod m,$$

$$j(I, J) = \begin{cases} (j(I-1, J-1) + \tilde{n}_I + n_q) \bmod n, & \text{if } i(I-1, J) + m_I \geq m \\ (j(I-1, J-1) + \tilde{n}_I) \bmod n, & \text{if } i(I-1, J) + m_I < m, \end{cases}$$

where, i(I, J) is a row coordinate in the original permutation matrix of the bit that has a position coordinate (I, J) in the interleaved permutation matrix, j(I, J) is a column coordinate in the original permutation matrix of the bit that has a position coordinate (I, J) in the interleaved permutation matrix, i=0, 1, ..., m−1, j=0, 1, ..., n−1, I=0, 1, ..., m−1, J=0, 1, ..., n−1, m and n are the number of columns and the number of rows of the original permutation matrix respectively, mod indicates a modulo operation, and $m_I$, $m_J$, $n_I$ and $n_J$ are derived from the interleaver selected by the following formulas:

$$m_I = m_i^{-1} \bmod m$$

$$m_J = ((m-m_j) \times m_I) \bmod m$$

$$n_I = ((n-n_j) \times n_J) \bmod n$$

$$n_J = n_j^{-1} \bmod n$$

where, $m_i$ and $m_j$ are designated positive integers which are relatively prime with m, $n_j$ is a designated positive integer which is relatively prime with n, $m_i^{-1}$ is the reciprocal of $m_i$ when $m_i$ mod m, $n_j^{-1}$ is the reciprocal of $n_j$ when $n_j$ mod n, and $m_i^{-1}$ and $n_j^{-1}$ are derived from the following formulas respectively:

$$(m_i m_i^{-1}) \bmod m = 1$$

$$(n_j n_j^{-1}) \bmod n = 1$$

and $\tilde{n}_I$, $\tilde{n}_J$, and $n_q$ are derived from the following formulas respectively:

$$\tilde{n}_I = (m_I n_I) \bmod n$$

$$\tilde{n}_J = (m_J n_I + n_J) \bmod n$$

$$n_q = (m \times (n - n_I)) \bmod n;$$

a first outputting unit configured to output the interleaved permutation matrix.

Another embodiment of the present invention also discloses a data block deinterleaving apparatus for communication equipments, including the following units:

a second obtaining unit configured to obtain an interleaved permutation matrix;

a deinterleaving unit configured to deinterleave the interleaved permutation matrix, wherein, the relationship between a position coordinate (I, J) of any one bit in the interleaved permutation matrix and a position coordinate (i', j') of the bit in the deinterleaved permutation matrix is:

if I=0, then $$i'(0, J) = (i'(m-1, J-1) + m_J) \bmod m$$

$$j'(0, J) = \begin{cases} (j'(m-1, J-1) + \tilde{n}_J + n_q) \bmod n, & \text{if } i'(m-1, J-1) + m_J \geq m \\ (j'(m-1, J-1) + \tilde{n}_J) \bmod n, & \text{if } i'(m-1, J-1) + m_J < m, \end{cases}$$

if I≠0, then $$i'(I, J) = (i'(I-1, J) + m_I) \bmod m,$$

$$j'(I, J) = \begin{cases} (j'(I-1, J-1) + \tilde{n}_I + n_q) \bmod n, & \text{if } i'(I-1, J) + m_I \geq m \\ (j'(I-1, J-1) + \tilde{n}_I) \bmod n, & \text{if } i'(I-1, J) + m_I < m, \end{cases}$$

where, i'(I, J) is a row coordinate in the deinterleaved permutation matrix of the bit that has a position coordinate (I, J) in the interleaved permutation matrix, j'(I, J) is a column coordinate in the deinterleaved permutation matrix of the bit that has a position coordinate (I, J) in the interleaved permutation matrix, i'=0, 1, ..., m−1, j'=0, 1, ..., n−1, I=0, 1, ..., m−1, J=0, 1, ..., n−1, m and n are the number of columns and the number of rows of the original permutation matrix respectively, mod indicates a modulo operation, and $m_I$, $m_J$, $n_I$ and $n_J$ are derived from the following formulas:

$$m_I = m_{i'}^{-1} \bmod m$$

$$m_J = ((m - m_{j'}) \times m_I) \bmod m$$

$$n_I = ((n - n_{j'}) \times n_J) \bmod n$$

$$n_J = n_{j'}^{-1} \bmod n$$

where, $m_{i'}$ and $m_{j'}$ are designated positive integers which are relatively prime with m, $n_{j'}$ is a designated positive integer which is relatively prime with n, $m_i^{-1}$ is the reciprocal of $m_i$ when $m_i$ mod m, $n_j^{-1}$ is the reciprocal of $n_j$ when $n_j$ mod n, and $m_i^{-1}$ and $n_j^{-1}$ are derived from the following formulas respectively:

$$(m_i m_i^{-1}) \bmod m = 1$$

$$(n_j n_j^{-1}) \bmod n = 1$$

and $\tilde{n}_I$, $\tilde{n}_J$, and $n_q$ are derived from the following formulas respectively:

$$\tilde{n}_I = (m_I n_I) \bmod n$$

$$\tilde{n}_J = (m_J n_I + n_J) \bmod n$$

$$n_q = (m \times (n - n_I)) \bmod n;$$

a second outputting unit configured to output the deinterleaved permutation matrix.

Another embodiment of the present invention also discloses a data transmitting method for OFDM (Orthogonal Frequency Division Multiplexing) communication equipments, including the data block interleaving steps in the above data block interleaving method for communication equipments.

Another embodiment of the present invention also discloses a data receiving method for OFDM communication equipments, including the data block deinterleaving steps in the above data block deinterleaving method for communication equipment.

Compared to prior art, the main differences and effects of the embodiments of the present invention are:

In the interleaving (or deinterleaving) method, the multiplication of original algorithms is replaced by the addition operation by using an iterative algorithm to replace the original modulo operation, when computing correspondence between the data before and after interleaving (or deinterleaving). Thus the hardware complexity is significantly reduced and the computing speed is accelerated, as the implementation complexity of the addition or subtraction operation is much less than that of the multiplication or division. And in the present invention where data addresses are computed on-the-fly using a simple hardware, there is no need for interleaving or deinterleaving mapping table (e.g., look-up table method), further it simplifies the hardware implementation.

Furthermore, the disclosed recursive calculation method of the application ensures that the left hand side variable (the dividend) of the modulo operation (mod) is less than twice right hand side (the divisor). Therefore, a simple comparison and a subtraction operation can be used to replace the complex standard mod operation (generally need multiplication or division, or successive subtractions), so that the hardware implementation complexity is significantly reduced in terms of semiconductor silicon area, power consumption, clock speed needed, and cost etc.

DETAILED DESCRIPTION OF THE PREFERRED EMBODIMENTS

Figures 1, 2:
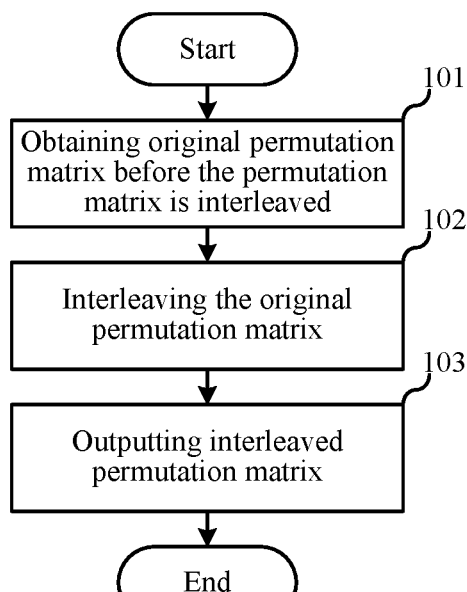
FIG. 1 illustrates a bits arrangement of original permutation matrix in q buffer of the ITU G.9902, ITU G.9902, IEEE P1901.2 or G3-PLC interleaver in prior art.
FIG. 2 illustrates a flow chart of a data block interleaving method for communication equipments according to the first embodiment of the present invention.

The following description provides plenty of technical details for readers to better understand this application. Those who skilled in the art will understand, however, these technical solutions required to be protected in the claims of the present invention can be practiced without many of these specific technical details and not based on all kinds of changes and modifications in following embodiments. The same reference numerals represent the same component or have the same meaning.

Embodiments of the present invention will be further described in detail so that the purpose, technical solution and advantages of the present invention will become clear.

The first embodiment of the present invention relates to a data block interleaving method for communication equipments. FIG. 2 is a flow chart of the data block interleaving method for communication equipments.

Specifically, as shown in FIG. 2, the data block interleaving method for communication equipments includes the following steps:

In step 101, obtaining an original permutation matrix before the permutation matrix is interleaved.

Then proceeding to step 102, interleaving the original permutation matrix, wherein the relationship between a position coordinate (i, j) of any one bit in the original permutation matrix and a position coordinate (I, J) of the bit in the interleaved permutation matrix is:

if I=0, then $$i(0, J) = (i(m-1, J-1) + m_J) \bmod m$$

$$j(0, J) = \begin{cases} (j(m-1, J-1) + \tilde{n}_J + n_q) \bmod n, & \text{if } i(m-1, J-1) + m_J \geq m \\ (j(m-1, J-1) + \tilde{n}_J) \bmod n, & \text{if } i(m-1, J-1) + m_J < m, \end{cases}$$

if I≠0, then $$i(I, J) = (i(I-1, J) + m_I) \bmod m,$$

$$j(I, J) = \begin{cases} (j(I-1, J-1) + \tilde{n}_I + n_q) \bmod n, & \text{if } i(I-1, J) + m_I \geq m \\ (j(I-1, J-1) + \tilde{n}_I) \bmod n, & \text{if } i(I-1, J) + m_I < m, \end{cases}$$

where, i(I, J) is a row coordinate in the original permutation matrix of the bit that has a position coordinate (I, J) in the interleaved permutation matrix, j(I, J) is a column coordinate in the original permutation matrix of the bit that has a position coordinate (I, J) in the interleaved permutation matrix, i(0, J) indicates a row coordinate in the original permutation matrix of the bit that has a position coordinate (0, J) in the interleaved permutation matrix, j(0, J) indicates a column coordinate in the original permutation matrix of the bit that has a position coordinate (0, J) in the interleaved permutation matrix, i=0, 1, ..., m−1, j=0, 1, ..., n−1, I=0, 1, ..., m−1, J=0, 1, ..., n−1; i(m−1, J−1) and j(m−1, J−1) respectively indicate the row and column coordinates in the original permutation matrix of the bit that has a position coordinate (m−1, J−1) in the interleaved permutation matrix, i(I−1, J) indicates a row coordinate in the original permutation matrix of the bit that has a position coordinate (I−1, J) in the interleaved permutation matrix, j(I−1, J−1) indicates a column coordinate in the original permutation matrix of the bit that has a position coordinate (I−1, J−1) in the interleaved permutation matrix, these four coordinates are known when interleaving the bit that has a position coordinate (I, J) in the interleaved permutation matrix; m and n are the number of columns and the number of rows of the original permutation matrix respectively, mod indicates a modulo operation, and $m_I$, $m_J$, $n_I$ and $n_J$ are derived from the following formulas:

$$m_I = m_i^{-1} \bmod m$$

$$m_J = ((m-m_j) \times m_I) \bmod m$$

$$n_I = ((n-n_j) \times n_J) \bmod n$$

$$n_J = n_j^{-1} \bmod n$$

where, $m_i$ and $m_j$ are designated positive integers which are relatively prime with m, $n_j$ is a designated positive integer which is relatively prime with n, $m_i^{-1}$ is the reciprocal of $m_i$ when $m_i \bmod m$ (is positive integer), $n_j^{-1}$ is the reciprocal of $n_j$ when $n_j \bmod n$ (is positive integer), and $m_i^{-1}$ and $n_j^{-1}$ are derived from the following formulas respectively:

$$(m_i m_i^{-1}) \bmod m = 1$$

$$(n_j n_j^{-1}) \bmod n = 1$$

and $\tilde{n}_I$, $\tilde{n}_J$, and $n_q$ are derived from the following formulas respectively:

$$\tilde{n}_I = (m_I n_I) \bmod n$$

$$\tilde{n}_J = (m_I n_I + n_J) \bmod n$$

$$n_q = (m \times (n-n_I)) \bmod n.$$

In the present embodiment, the modulo operation is implemented as follows:
the left hand side operand (the dividend) of the mod operator is compared with the right hand side operand (the divisor), if the left hand side operand is greater than or equal to the right hand side operand, then the right hand side operand is subtracted from the left hand side operand, and obtained difference is taken as the result of the modulo operation; if the left hand side operand is less than the left hand side operand, then the left hand side operand is taken as the result of the modulo operation.

In the present invention, although internal units will run a variety of arithmetic operations, the multiplication and division should be avoided because their corresponding circuits take much longer execution time and much larger hardware resources. Since the interleaving coordinate index is calculated recursively, the above calculation method ensures that the dividend of modulo operation (mod) is less than twice the divisor. Therefore, a simple comparison and subtraction operation can be used to replace the complex standard mod operation which would require successive subtractions, division, or multiplication operations, therefore the hardware computational complexity is significantly reduced.

Furthermore, in the present embodiment, the above data block includes n OFDM symbols, each OFDM symbol includes m subcarriers.

Then this flow proceeds to step 103, outputting the interleaved permutation matrix.

And then, this flow is concluded.

In the present embodiment, the above data block interleaving method is used in ITU G.9902, ITU G.9903, IEEE P1901.2 or G3-PLC FEC standards.

In the below, ITU G.9902 and ITU G.9903 (or G3-PLC) interleaving standards are taken as examples to describe a practical implementation process of the interleaving method. The basic operation of the interleaver applying above two interleaving standards are described as following:

(1) ITU G.9902 Interleaver

The ITU G.9902 interleaver is designed to combat both frequency domain and time domain erasures, including repetitive erasures with a period of ½ Alternating Current (referred to as "AC") cycle (50 Hz or 60 Hz) and duration up to ¼ AC cycle, while enhancing a receiver sensitivity against Additive White Gaussian Noise (referred as "AWGN"). For the payload, the interleaver first splits the payload into fragments. Then each fragment may be repeated for 2, 4, 6 or 12 times to increase robustness, and interleaved using one of the interleave-over-fragment (IoF) mode and the interleave-over-AC-cycle (IoAC) mode. In interleave-over-fragment (IoF) mode, each fragment is interleaved as it is. Interleave-over-AC-cycle (IoAC) mode is designed for channels with severe periodic erasures, such as a power line carrier channel. In this mode, prior to interleaving, copies of each fragment are padded by additional repetitions to the closest multiple of ¼ AC cycles. In both modes, if repetitions are used, bits from each fragment copy, except the first fragment, are cyclically shifted relative to the previous copy, to scatter errors over frequency. An even more robust interleaver is defined for the header of the fragment copy in the following.

Figure 4:
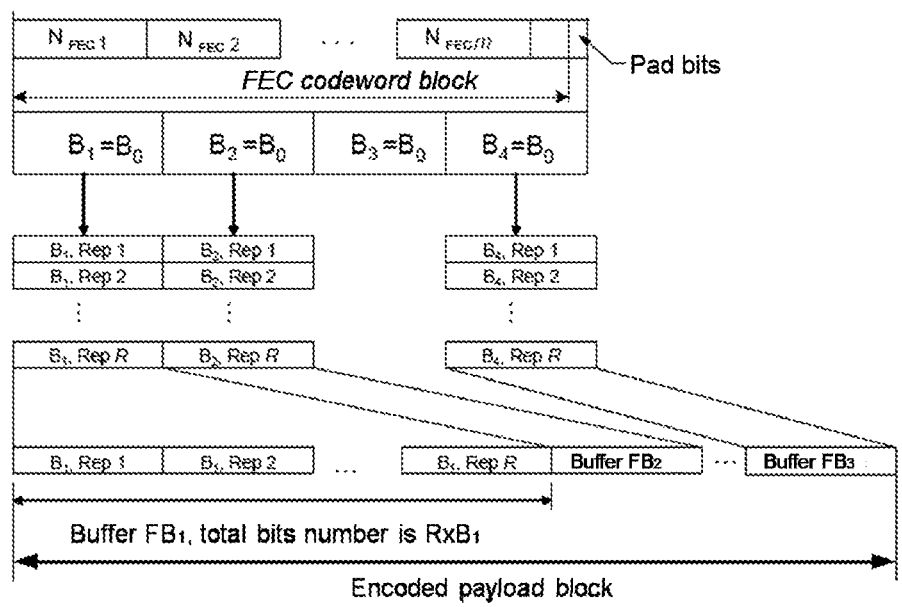
FIG. 4 illustrates an encoded payload block generated by the G.9902 interleaver according to the first embodiment of the present invention.

FIG. 4 shows an encoded payload block generated by the G.9902 interleaver in the embodiment. As shown in FIG. 4, we define m as the number of valid data carriers in each OFDM symbol, n as the number of OFDM symbols used by each frame. $B_0$ is the fragment size. The fragment repetition encoder (FRE) provides repetitions of fragments with the repetition rate of R (e.g. Rep 1, Rep 2, ..., Rep R etc. shown in FIG. 4). Each fragment shall be copied R times and all copies shall be concatenated into the fragment buffer (FB), so that the first bit of each copy follows the last bit of previous copy, see FIG. 4. The total size of the FB is $B_0 \times R$ bits (as FB1 in FIG. 4). The FRE shall support the values R=1, 2, 4, 6, 12 (value R=1 corresponds to a normal mode of operation). If R=1, a FB shall contain a single fragment of $B_0$ bits accordingly. The $B_0$ input bits shall be written into the permutation matrix with n rows and m columns. The bits are inserted into the matrix by using the equations below:

$$j = \text{floor}(p/m)$$

$$i = \bmod(p, m)$$

where p is the sequential number of the bit in the input sequence (input vector), in the range from 0 to $B_1-1$; i is the column index of the permutation matrix, its range is 0~m−1, j is the row index, its range is 0~n−1 (m columns and n rows); floor(x) indicates truncation operation on x.

Figure 5:
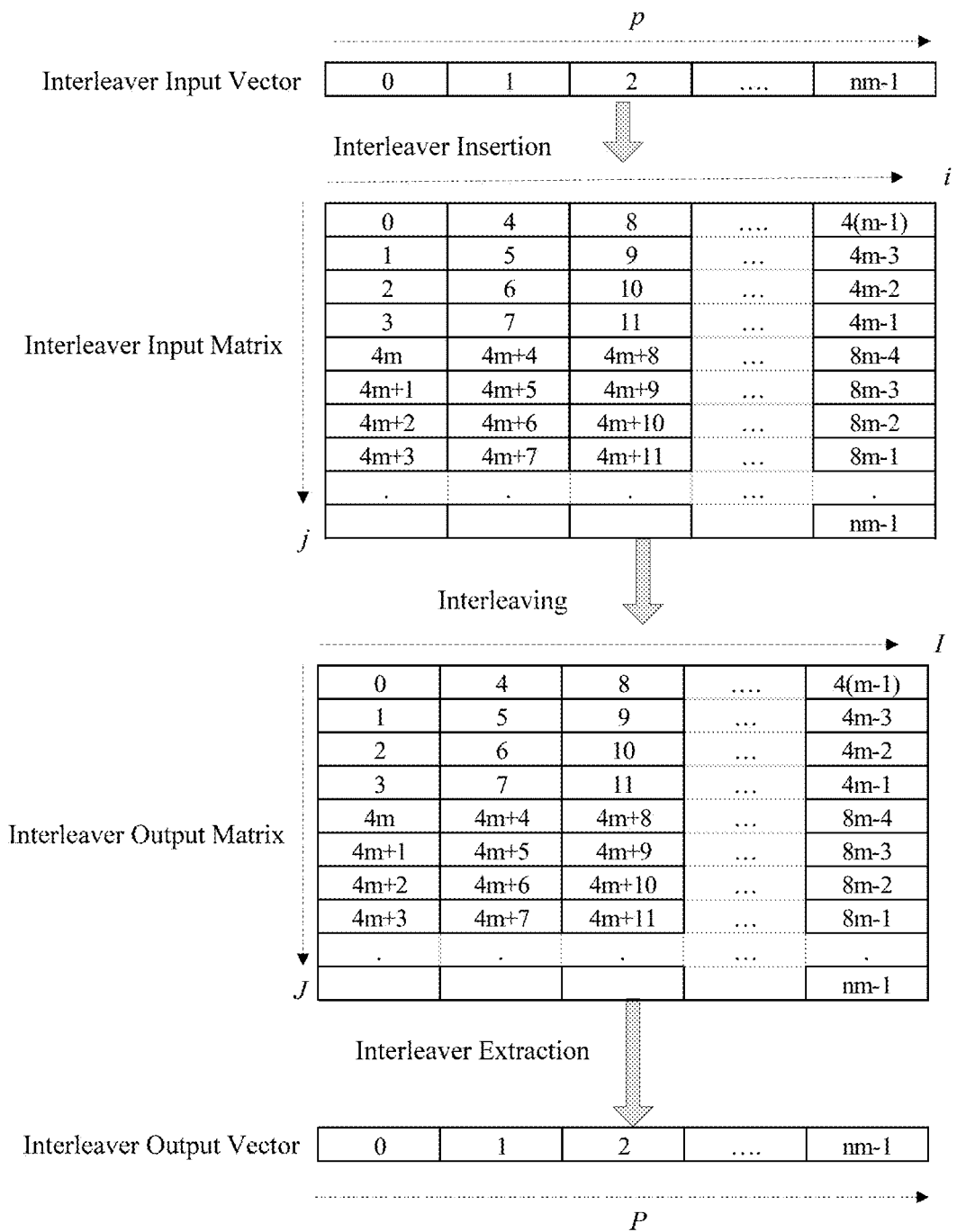
FIG. 5 illustrates a process of inserting the bits into the permutation matrix with k=4 according to the first embodiment of the present invention.

FIG. 5 shows a process of inserting the bits into the permutation matrix when the above equations are used with k=4 where k is the modulation used (k=1, for 1-bit modulation, k=4 for 4-bit modulation etc). As shown in FIG. 5, each box in the figure represents a bit. The number in each box indicates the position of the input bit in the input bit sequence (input vector) and in the output bit sequence (output vector), respectively. The input bits are arranged according to the input vector sequence in the whole process, and form an interleaving input matrix according to the figure for interleaving. Then elements of the interleaved output matrix are outputted according to the output vector sequence.

In this embodiment, insertion and extraction operations of the interleaver are not physically performed, instead the interleaver input (interleaving) matrix index (i, j) (that is, the coordinate of the bit in the original permutation matrix) is calculated based on the interleaver output (interleaved) matrix index (I,J) (that is, the coordinate of the bit in the interleaved permutation matrix). We can calculate the input vector sequential number p from (i, by the following formula:

$$p=M2V(i,j,m,k)=\text{floor}(j/k) \times m \times k + \text{mod}(j,k) + i \times m$$

Since k=1, 2 or 4 for G.9902 interleaver, floor(j/k) can be implemented by shifting j by 0, 1, or 2 bits to the right, respectively. And mod(j,k) can also be simplified as mod(j, k)=j mod k=j & (k−1), where "&" denotes "bit-wise AND" operation. Similarly, the interleaver output vector sequential number P can be calculated using P=M2V(I, J, m, k).

In fragment repetition encoding, prior to interleaving, the bits of each fragment copy starting from the second copy (e.g. "Rep 2" in FIG. 4) shall be cyclically shifted by M=ceiling ($B_0/R_T$) bits relative to the previous copy in the direction from LSB (Least Significant Bit) to MSB (Most Significant Bit), i.e., the copy "Rep(d+1)" shall be shifted by d×M bits relative to the copy "Rep 1", so that the LSB of the copy "Rep 1" will have bit number d×M in the copy "Rep(d+1)". The value of $R_T \geq R$ is the total number of repetitions, including padding, which depends on the mode of interleaving. The above M indicates the smallest integer that is great than or equal to $B_0/R_T$.

(2) ITU G.9903 (or G3-PLC) Interleaver

In this embodiment, repetition codes are used in both robust (ROBO) mode (repeated 4 times, so referred to as "RC4") and super robust (Super ROBO) mode (repeated 6 times, so referred to as "RC6") of ITU G.9903 (or G3-PLC) interleaver, and the underlying modulation is DBPSK (Differential Binary Phase Shift Keying). In robust mode, every bit at the output of the convolutional encoder is repeated four times and then passed as input to the interleaver. This encoder (RC4) of repetition codes is only activated in robust mode.

As usual, m is defined as the number of valid data carriers in each OFDM symbol, n as the number of OFDM symbols used by each frame (i.e. the number of OFDM symbols in the interleaved data block), and Total_num_of_bits is the total number of coded bits including the padding bits.

$$n = \text{ceil}\left(\frac{\text{Total\_num\_of\_bits}}{4 \cdot m \cdot k}\right) \times 4$$

where, k=1, 2, 3, 4 is the modulation constellation size, i.e., the number of bits per constellation symbol. Function ceil(x) indicates the smallest integer that is greater than or equal to x.

Figures 6, 7:
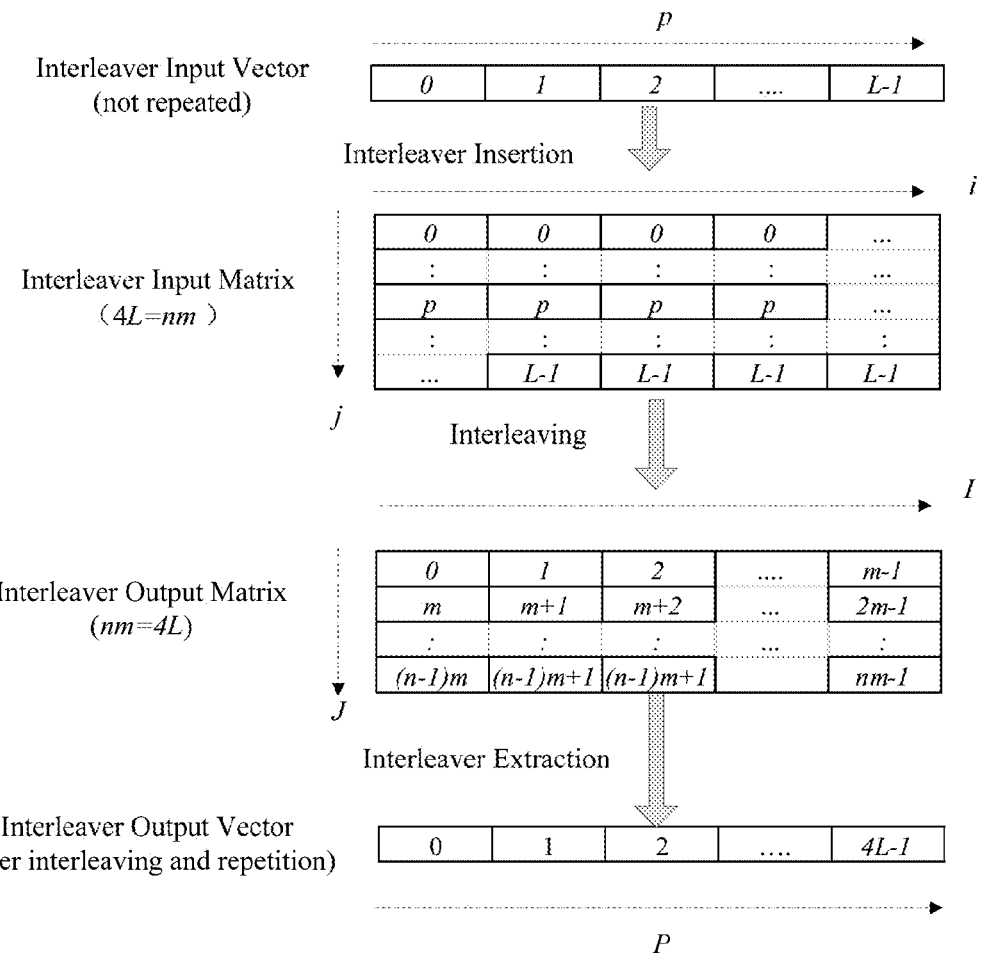
FIG. 6 illustrates an order of the bits which are inserted into the buffer of the G3-PLC or P1901.2, G.9903 interleaver according to the first embodiment of the present invention.
FIG. 7 illustrates a write-in and read-out order of the permutation matrix of G3-PLC RC4 mode according to the first embodiment of the present invention.

In ITU G.9903, IEEE P1901.2 or G3-PLC standard, corresponding permutation matrix of the DBPSK modulation is defined as elementary permutation matrix, while DQPSK (Differential Quadrature Phase Shift Keying) modulation and D8PSK (Differential 8-ary Phase Shift Keying) modulation use two and three times the elementary permutation matrix, respectively. Thus, the dimension of the permutation matrix for DQPSK and D8PSK modulations are m columns and n·k rows. FIG. 6 shows the order of the bits as they are inserted into the buffer of the G3-PLC interleaver (i.e. inputted row by row). As shown in FIG. 6, the data to be interleaved are stored in the input buffer and their dimensions are m columns and nk rows.

After interleaving, the output of the buffer is read out row by row by the mapping unit for modulation. Each sequence of k bit(s) is (are) mapped to an OFDM subcarrier.

FIG. 7 is a schematic diagram of a write-in and read-out order of the permutation matrix of G3-PLC RC4 mode. As shown in FIG. 7, each box indicates a bit, the number in each box indicates the position of the input bit in the input sequence (input vector) and in the output sequence (output vector), respectively. The input bits are arranged according to the input vector sequence in the whole process, and the same bits are repeated 4 times to form an interleaving input matrix for interleaving according to the figure. Then elements of the interleaved output matrix are outputted according to the output vector sequence. In this way, only L bits are stored in the input sequence vector and the output sequence vector will have 4L bits after 4 times of repeating and interleaving.

In the present invention, the interleaver engine will handle RC4 (repeating 4 times) directly without physically repeating every bit four times, while for RC6 (FCH), we need to physically repeat every bit 6 times to form the interleaver input vector and perform interleaving permutation accordingly. In the RC4 mode, input vector sequence number of the interleaver can be derived as p=floor((j×m+i)/4) (for k=1, DBPSK), and m is chosen to be a multiple of 4, e.g., m=36, or 72 in G.9903 or G3-PLC standards.

The generation of interleaving indices for both the ITU G.9902 interleaver and the ITU G.9903 (or G3-PLC) interleaver will be described in the following:

Both the ITU G.9902 and G3-PLC interleavers share the same original permutation matrix which is an n-by-m permutation matrix. The relation between input (before interleaving) and output (after interleaving) indices is determined from the following formulas:

$$I=(i \cdot m_i + J \cdot m_j) \bmod m$$

$$J=(j \cdot n_j + i \cdot n_i) \bmod n$$

($m_i$, $m_j$) and ($n_i$, $n_j$) in the formulas are selected such that:

$$\text{GCD}(m_i,m)=\text{GCD}(m_j,m)=\text{GCD}(n_i,n)=\text{GCD}(n_j,n)=1$$

GCD(a, b) in the formula indicates the greatest common divisor of two positive integers, a and b. A good set of above parameters can be found based on following two parameters m and n by performing a simple search, wherein, m is the number of subcarriers comprised in each OFDM symbol, n is the number of OFDM symbols in the interleaving data block.

In transmitter, we need to map interleaved bits into subcarrier constellation symbol by symbol, given (I, J), i.e., the $I^{th}$ subcarrier of the $J^{th}$ symbol. In order to implement an in-place interleaver, we need to derive a reverse interleaver formula as follows:

$$i=(I \times m_I + J \times m_J) \bmod m$$

$$j=(i \times n_I + J \times n_J) \bmod n$$

$m_I$, $m_J$, $n_I$ and $n_J$ can be determined by the formulas described above.

In order to simplify the modulo operation in calculating (i, j), we need to derive a recursive (iterative) algorithm starting from the first symbol, J=0, I=0, 1, . . . , m−1, and then J=1, 2, . . . , n−1, making sure that during each iteration the modulo operation only needs to check if the calculated index i or j crosses its respective modulo limit; if yes, performing one subtraction. At last, an iterative algorithm of the i and j can be obtained from the relationship between the position coordinate (i, j) of any one bit in the original permutation matrix and the position coordinate (I, J) of the bit in the interleaved permutation matrix.

Figure 8:
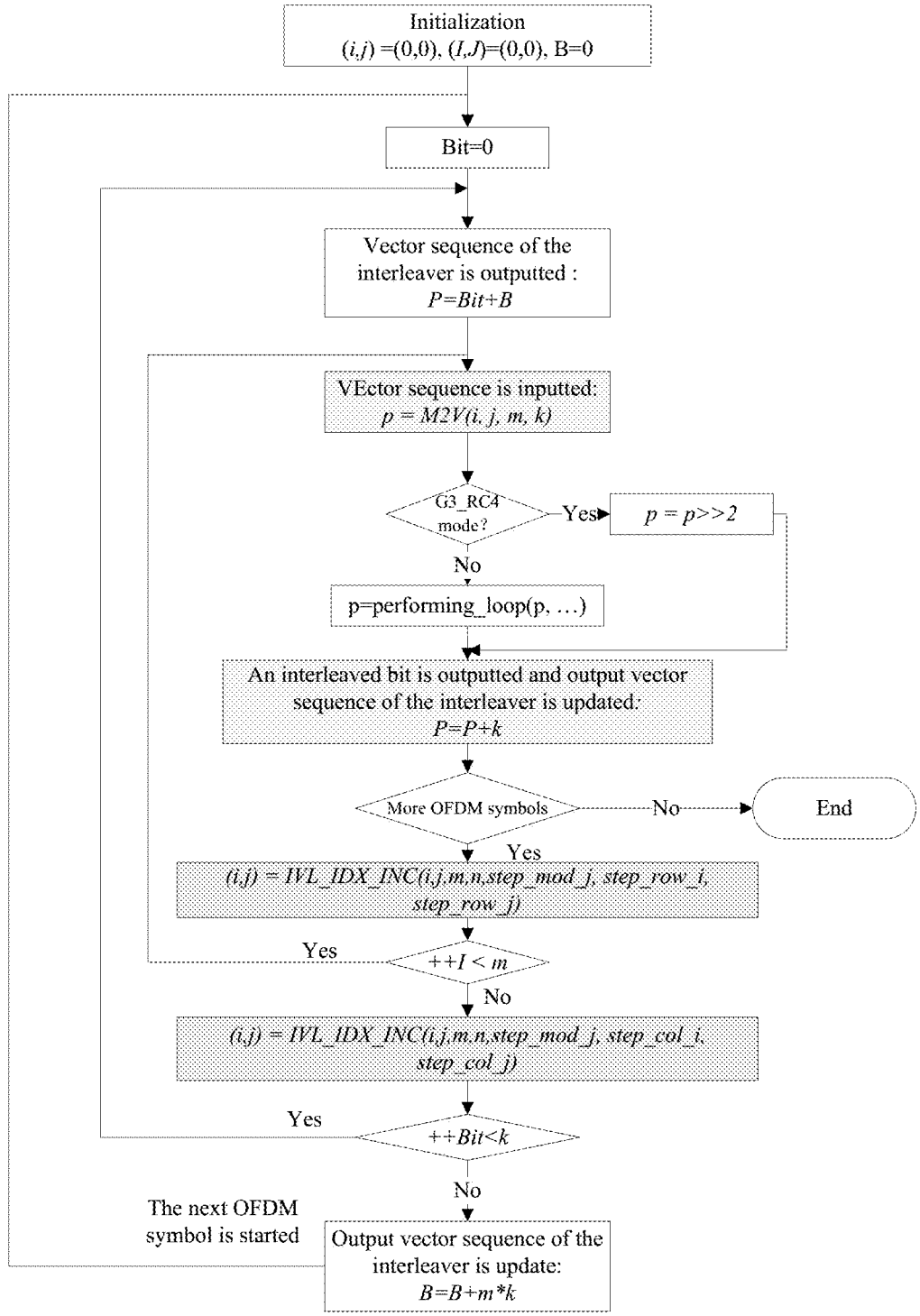
FIG. 8 illustrates a flow chart of generating the input and output vector indexes of the interleaver according to the first embodiment of the present invention.

In another embodiment of the present invention, one example of the interleaver address generation process of the input vector and output vector indexes of above interleaver is shown in FIG. 8:

First, performing an initialization to make (i, j)=(0, 0), (I,J)=(0,0), B=0; then the variable Bit is given the value of 0, and the value of the output vector sequence number (address) of the interleaver is set to P=B+Bit; the input vector sequence number (address) p of the interleaver can be calculated by p=M2V (i, j, m, k); if the mode is PLC-G3 RC4, then p is shifted two bits to the right (divided by 4); if the interleaver is in ITU G.9902 mode, a loop operation is performed on p. At this time, the output vector sequential number P and the corresponding input vector sequential number p of the interleaver have been calculated, so that an interleaved bit can be outputted and then whether or not there is further OFDM symbols need to be processed is determined. If it is, function (i, j)=IVL_IDX_INC(i,j,m,n, step_mod_j, step_row_i, step_row_j) is executed to perform an iterative operation to obtain (i, j) and the output vector sequence number P of the interleaver is updated to P=P+k (k is the number of bits per subcarrier constellation symbol), the specific operation of the function is shown as FIG. 9. The subcarrier index I is automatically incremented by 1, and then check if it is smaller than m, if so, compute the input vector sequence number p of the interleaver to get the next bit, and then repeat the above steps; if it is not, meaning the $J^{th}$ symbol is filled up, and then go to process next symbol, J=J+1, and function (i,j)=IVL_IDX_INC(i,j,m,n,step_mod_j, step_col_i, step_col_j) is executed, the value of (i, j) is updated; then the constellation bit counter, Bit, is automatically incremented by 1, if the constellation bit count is smaller than k, then return back to get more interleaved bits and repeat the above operations. If the constellation bit count is greater than or equal to k, the starting address of the next block of the output vector of the interleaver is updated, and the whole process of calculating the value (i, j) of the symbol is repeated for the next OFDM symbol. This flow is ended after all OFDM symbols have been calculated.

Wherein, m is the number of columns of the above original matrix (i.e. the number of subcarriers), n is the number of rows of the original matrix (i.e. the number of OFDM symbols); step_col_i=$m_I$ is incremental step for each I increment for i index; step_col_j=$m_J$ is incremental step for each J increment for i index; step_row_i=$ñ_I$ is incremental step for each I increment for j index; step_row_j=$ñ_J$ is incremental step for each J increment for j index; step_mod_j=$n_q$ is modification factor due to i iteration overflow for j index.

Figure 9:
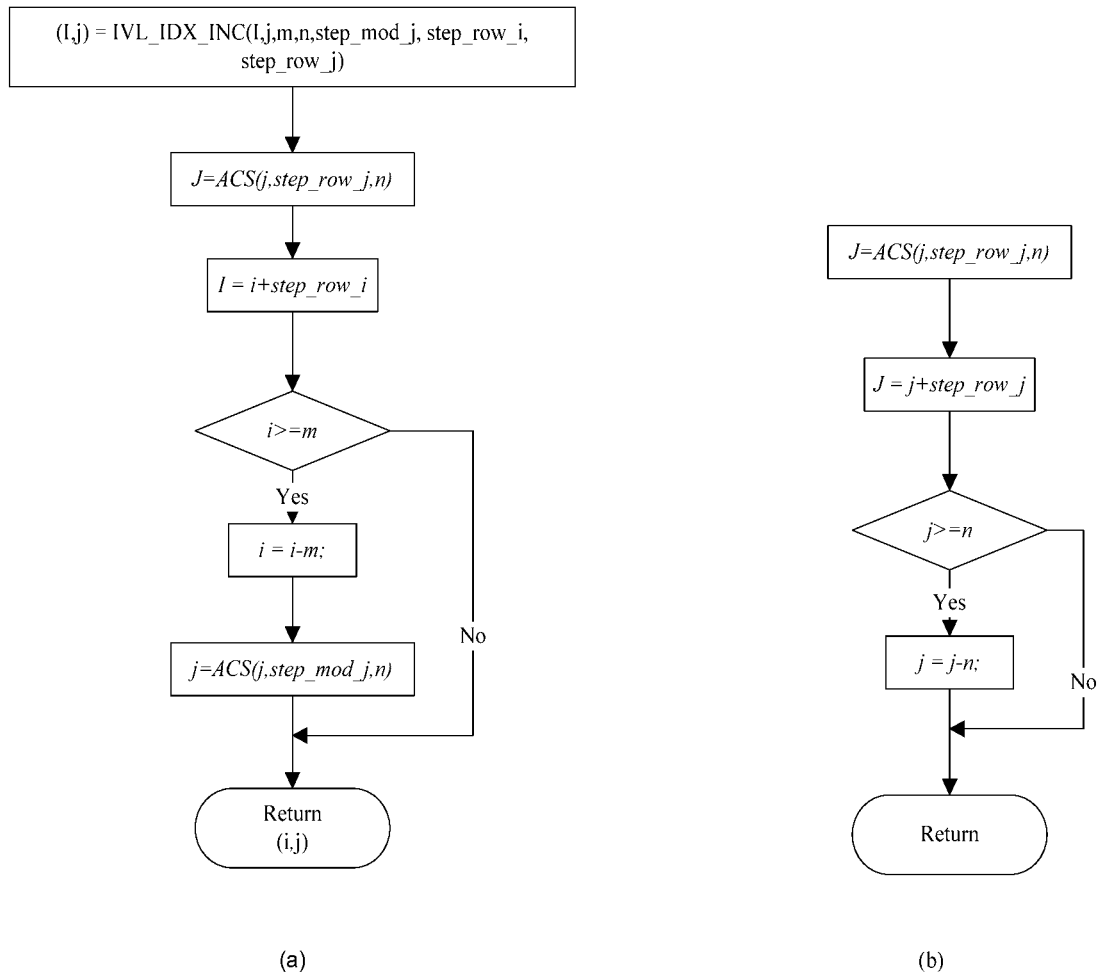
FIG. 9(a) illustrates a flow chart of executing the function (i,j)=IVL_IDX_INC (i,j,m,n,step_mod_i,step_j) according to the first embodiment of the present invention.
FIG. 9(b) illustrates a flow chart of executing the function ACS(j,step_i,j) according to the first embodiment of the present invention.

In this embodiment, specific implementing process of function (i,j)=IVL_IDX_INC is shown in FIG. 9(*a*) (e.g. parameter (i,j,m,n,step_mod_j, step_row_i, step_row_j)). First, function ACS(j,step_row_j,n) is called. Input parameters j, step_row_j and n are computed (as shown in FIG. 9(*b*)) to get the value of j that meets the condition of j<n. Then if the value of i plus step of i (step_row_i) is greater than or equal to the value of m is determined. If the determination is Yes, then m is subtracted from i, and function ACS is called again, new parameters j, step_row_j and n are inputted. Then return to the function (i,j)=IVL_IDX_INC and the next step is implemented by this function. If the determination is No, return to the function (i,j)=IVL_IDX_INC directly and the next step is implemented by this function.

In the interleaving method, the multiplication of original algorithms is replaced by the addition operation by using an iterative algorithm to replace the original modulo operation, when computing correspondence between the data before and after interleaving. Thus the hardware complexity is significantly reduced and the computing speed is accelerated, as the implementation complexity of the addition or subtraction operation is much less than that of the multiplication or division. And in the present invention where data addresses are computed on-the-fly using a simple hardware, there is no need for interleaving or deinterleaving mapping table (e.g., look-up table method), further it simplifies the hardware implementation.

Figure 3:
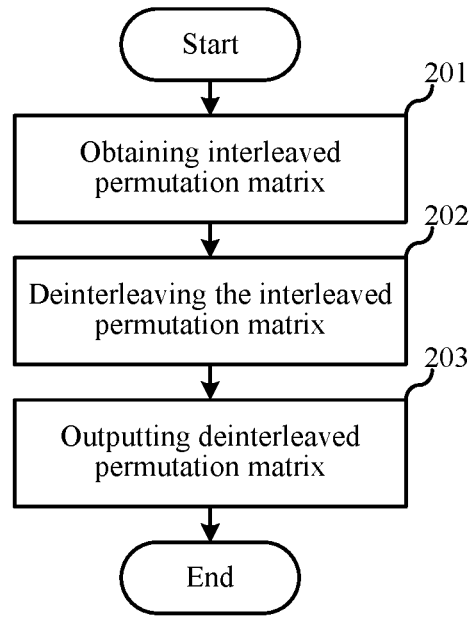
FIG. 3 illustrates a flow chart of a data block deinterleaving method for communication equipments according to the second embodiment of the present invention.

The second embodiment of the present invention relates to a data block deinterleaving method for communication equipments. FIG. 3 is a flow chart of the data block deinterleaving method for communication equipments. The data block deinterleaving method for communication equipments includes the following steps:

In step 201, obtaining an interleaved permutation matrix.

Then proceeds to step 202, deinterleaving the interleaved permutation matrix, wherein, the relationship between a position coordinate (I, J) of any one bit in the interleaved permutation matrix and a position coordinate (i', j') of the bit in the deinterleaved permutation matrix is:

if I=0, then $$i'(0, J) = (i'(m-1, J-1) + m_J) \bmod m$$

$$j'(0, J) = \begin{cases} (j'(m-1, J-1) + ñ_J + n_q) \bmod n, & \text{if } i'(m-1, J-1) + m_J \geq m \\ (j'(m-1, J-1) + ñ_J) \bmod n, & \text{if } i'(m-1, J-1) + m_J < m, \end{cases}$$

if I≠0, then $$i'(I, J) = (i'(I-1, J-1) + m_I) \bmod m$$

$$j'(I, J) = \begin{cases} (j'(I-1, J-1) + ñ_I + n_q) \bmod n, & \text{if } i'(I-1, J) + m_I \geq m \\ (j'(I-1, J-1) + ñ_I) \bmod n, & \text{if } i'(I-1, J) + m_I < m, \end{cases}$$

where, i'(I, J) is a row coordinate in the deinterleaved permutation matrix of the bit that has a position coordinate (I, J) in the interleaved permutation matrix, j'(I, J) is a column coordinate in the deinterleaved permutation matrix of the bit that has a position coordinate (I, J) in the interleaved permutation matrix, i'(0, J) indicates a row coordinate in the deinterleaved permutation matrix of the bit that has a position coordinate (0, J) in the interleaved permutation matrix, j'(0, J) indicates a column coordinate in the deinterleaved permutation matrix of the bit that has a position coordinate (0, J) in the interleaved permutation matrix, i'=0, 1, . . . , m−1, j'=0, 1, . . . , n−1, I=0, 1, . . . , m−1, J=0, 1, . . . , n−1; i' (m−1, J−1) and j'(m−1, J−1) indicate a row coordinate and a column coordinate in the deinterleaved permutation matrix of the bit that has a position coordinate (m−1, J−1) in the interleaved permutation matrix respectively, i'(I−1, J) indicates a row coordinate in the deinterleaved permutation matrix of the bit that has a position coordinate (I−1, J) in the interleaved permutation matrix, j'(I−1, J−1) indicates a column coordinate in the deinterleaved permutation matrix of the bit that has a position coordinate (I−1, J−1) in the interleaved permutation matrix, these four coordinates are known when deinterleaving the bit that has a position coordinate (I, J) in the interleaved permutation matrix, these four coordinates are known when deinterleaving the bit that has a position coordinate (I, J) in the interleaved permutation matrix; m and n are the number of columns and the number of rows of the original permutation matrix respectively, mod indicates a modulo operation, and $m_I$, $m_J$, $n_I$ and $n_J$ are derived from the following formulas:

$$m_I = m_{i'}^{-1} \bmod m$$

$$m_J = ((m - m_{j'}) \times m_I) \bmod m$$

$$n_I = ((n - n_{j'}) \times n_J) \bmod n$$

$$n_J = n_{j'}^{-1} \bmod n$$

where, $m_{i'}$ and $m_{j'}$ are designated positive integers which are relatively prime with m, $n_{j'}$ is a designated positive integer which is relatively prime with n, $m_i^{-1}$ is the reciprocal of $m_i$ when $m_i$ mod m, $n_j^{-1}$ is the reciprocal of $n_j$ when $n_j$ mod n, and $m_i^{-1}$ and $n_j^{-1}$ are derived from the following formulas respectively:

$$(m_i m_i^{-1}) \bmod m = 1$$

$$(n_j n_j^{-1}) \bmod n = 1,$$

and $\tilde{n}_I$, $\tilde{n}_J$, and $n_q$ are derived from the following formulas respectively:

$$\tilde{n}_I = (m_J n_I) \bmod n$$

$$\tilde{n}_J = (m_J n_I + n_J) \bmod n$$

$$n_q = (m \times (n - n_I)) \bmod n_o$$

In the present embodiment, the modulo operation is implemented as following:

the left hand side operand (the dividend) of the mod operator is compared with the right hand side operand (the divisor), if the left hand side operand is greater than or equal to the right hand side operand, then the right hand side operand is subtracted from the left hand side operand, the modulo result take the difference as result; if the left hand side operand is less than the right hand side operand, the modulo result takes the left hand side operand as result.

Furthermore, in the present embodiment, the above data block includes n OFDM symbols, each OFDM symbol includes m subcarriers.

Then proceeds to step 203, outputting the deinterleaved permutation matrix.

And then, this flow is concluded.

In this embodiment, the above data block deinterleaving method is used in ITU G.9902, ITU G.9903, IEEE P1901.2 or G3-PLC FEC standards.

In the present invention, although internal deinterleaving calculations will run a variety of arithmetic operations, the multiplication and division should be avoided because their corresponding circuits take much longer execution time and much larger hardware resources. Since the deinterleaving coordinate index is calculated recursively, the above calculation method ensures that the left side value (dividend) of modulo operation (mod) is less than twice the right side value (divisor). Therefore, a simple comparison and subtraction operation can be used to replace the complex standard mod operation which would require successive subtractions, division, or multiplication operations, therefore the hardware computational complexity is significantly reduced.

Figure 10:
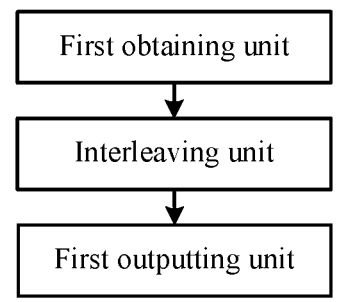
FIG. 10 illustrates a structure diagram of a data block interleaving apparatus for communication equipments according to the third embodiment of the present invention.

The third embodiment of the present invention relates to a data block interleaving apparatus in communication equipments. FIG. 10 is a structure diagram of the data block interleaving apparatus for communication equipments.

Specifically, as shown in FIG. 10, the data block interleaving apparatus includes the following units:

A first obtaining unit configured to obtain an original permutation matrix before the permutation matrix is interleaved.

An interleaving unit configured to interleave the original permutation matrix, wherein, the relationship between a position coordinate (i, j) of any one bit in the original permutation matrix and a position coordinate (I, J) of the bit in the interleaved permutation matrix is:

if I=0, then $$i(0, J) = (i(m-1, J-1) + m_J) \bmod m$$

$$j(0, J) = \begin{cases} (j(m-1, J-1) + \tilde{n}_J + n_q) \bmod n, & \text{if } i(m-1, J-1) + m_J \geq m \\ (j(m-1, J-1) + \tilde{n}_J) \bmod n, & \text{if } i(m-1, J-1) + m_J < m, \end{cases}$$

if I≠0, then $$i(I, J) = (i(I-1, J) + m_I) \bmod m,$$

$$j(I, J) = \begin{cases} (j(I-1, J-1) + \tilde{n}_I + n_q) \bmod n, & \text{if } i(I-1, J) + m_I \geq m \\ (j(I-1, J-1) + \tilde{n}_I) \bmod n, & \text{if } i(I-1, J) + m_I < m, \end{cases}$$

where, i(I, J) is a row coordinate in the original permutation matrix of the bit that has a position coordinate (I, J) in the interleaved permutation matrix, j(I, J) is a column coordinate in the original permutation matrix of the bit that has a position coordinate (I, J) in the interleaved permutation matrix, i=0, 1, ..., m−1, j=0, 1, ..., n−1, I=0, 1, ..., m−1, J=0, 1, ..., n−1, m and n are the number of columns and the number of rows of the original permutation matrix respectively, mod indicates a modulo operation, and $m_I$, $m_J$, $n_I$ and $n_J$ are derived from the following formulas:

$$m_I = m_{i'}^{-1} \bmod m$$

$$m_J = ((m - m_j) \times m_I) \bmod m$$

$$n_I = ((n - n_j) \times n_J) \bmod n$$

$$n_J = n_j^{-1} \bmod n$$

where, $m_i$ and $m_j$ are designated positive integers which are relatively prime with m, $n_j$ is a designated positive integer which is relatively prime with n, $m_i^{-1}$ is the reciprocal of $m_i$ when $m_i$ mod m, $n_j^{-1}$ is the reciprocal of $n_j$ when $n_j$ mod n, and $m_i^{-1}$ and $n_j^{-1}$ are derived from the following formulas respectively:

$$(m_i m_i^{-1}) \bmod m = 1$$

$$(n_j n_j^{-1}) \bmod n = 1$$

and $\tilde{n}_I$, $\tilde{n}_J$, and $n_q$ are derived from the following formulas respectively:

$$\tilde{n}_I=(m_J n_I)\bmod n$$

$$\tilde{n}_J=(m_J n_I+n_J)\bmod n$$

$$n_q=(m\times(n-n_I))\bmod n.$$

In this embodiment, the interleaving unit further includes the following subunit:

A first modulo subunit configured to compare operand on both sides of the mod, if the left hand side operand is greater than or equal to the right hand side operand, then the right hand side operand is subtracted from the left hand side operand, and the obtained difference is taken as the result of the modulo operation; if the left hand side operand is less than the left hand side operand, then the left hand side operand is taken as the result of the modulo operation.

A first outputting unit configured to output an interleaved permutation matrix.

Figure 11:
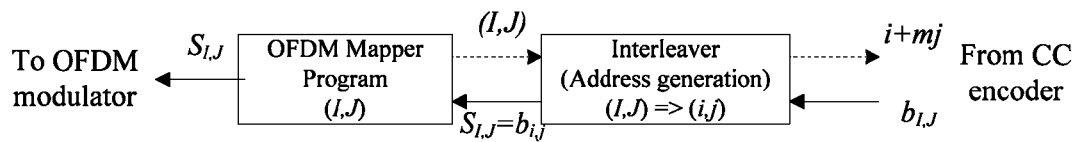
FIG. 11 illustrates a work flow chart of an interleaver in practical application according to the third embodiment of the present invention.

Preferably, FIG. 11 is a work flow chart of an interleaver in practical application in this embodiment. Dashed lines represent a generating process of bit read address(i, j) and solid lines represent an output process of the data bits in the figure. The position coordinate (i, j), i.e. its position(i+mj) in the input sequence vector, in the original permutation matrix of the data corresponding to $S_{IJ}$ is computed by an interleaver address generation unit when the $J^{th}$ subcarrier symbol $S_{IJ}$ of the $I^{th}$ OFDM symbol is processed by an OFDM mapper unit; the bit $b_{ij}$ is read out by the interleaver read unit, then it is transformed to the subcarrier symbol $S_{IJ}$ by the OFDM mapper unit; it can be sent to the OFDM modulator for further processing after all subcarriers of $I^{th}$ OFDM symbol have been mapped.

The first embodiment is the method embodiment corresponding to this embodiment, this embodiment and the first embodiment can be implemented in cooperation with each other. Correlated technical details disclosed in the first embodiment are still effective in this embodiment and will not be repeated here in order to reduce duplication. Correspondingly, correlated technical details disclosed in this embodiment can also be applied in the first embodiment.

Figure 12:
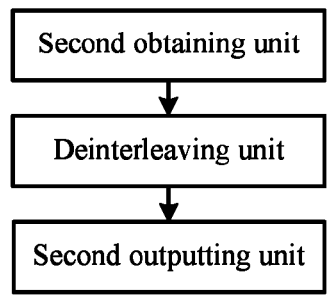
FIG. 12 illustrates a structure diagram of s data block deinterleaving apparatus for communication equipments according to the fourth embodiment of the present invention.

The fourth embodiment of the present invention relates to a data block deinterleaving apparatus for communication equipments. FIG. 12 is a structure diagram of the data block deinterleaving apparatus for communication equipment.

Specifically, as shown in FIG. 12, the data block deinterleaving apparatus includes following units:

A second obtaining unit configured to obtain interleaved permutation matrix.

A deinterleaving unit configured to deinterleave the interleaved permutation matrix, wherein, the relationship between position coordinate (I, J) of any one bit in the interleaved permutation matrix and position coordinate (i', j') of the bit in deinterleaved permutation matrix is:

if I=0, then $$i'(0, J) = (i'(m-1, J-1)+m_J)\bmod m$$

$$j'(0, J) = \begin{cases} (j'(m-1, J-1)+\tilde{n}_J+n_q)\bmod n, & \text{if } i'(m-1, J-1)+m_J \geq m \\ (j'(m-1, J-1)+\tilde{n}_J)\bmod n, & \text{if } i'(m-1, J-1)+m_J < m, \end{cases}$$

if I≠0, then $$i'(I, J) = (i'(I-1, J)+m_I)\bmod m,$$

$$j'(I, J) = \begin{cases} (j'(I-1, J-1)+\tilde{n}_I+n_q)\bmod n, & \text{if } i'(I-1, J)+m_I \geq m \\ (j'(I-1, J-1)+\tilde{n}_I)\bmod n, & \text{if } i'(I-1, J)+m_I < m, \end{cases}$$

where, i'(I, J) is a row coordinate in the deinterleaved permutation matrix of the bit that has a position coordinate (I, J) in the interleaved permutation matrix, j'(I, J) is a column coordinate in the deinterleaved permutation matrix of the bit that has a position coordinate (I, J) in the interleaved permutation matrix, i'=0, 1, . . . , m−1, j'=0, 1, . . . , n−1, I=0, 1, . . . , m−1, J=0, 1, . . . , n−1, m and n are the number of columns and the number of rows of the original permutation matrix respectively, mod indicates a modulo operation, and $m_J$, $n_I$ and $n_J$ are derived from the following formulas:

$$m_I=m_{i'}^{-1}\bmod m$$

$$m_J=((m-m_{j'})\times m_I)\bmod m$$

$$n_I=((n-n_{j'})\times n_J)\bmod n$$

$$n_J=n_{j'}^{-1}\bmod n$$

where, $m_{i'}$ and $m_{j'}$ are designated positive integers which are relatively prime with m, $n_{j'}$ is a designated positive integer which is relatively prime with n, $m_i^{-1}$ is the reciprocal of $m_i$ when $m_i$ mod m, $n_j^{-1}$ is the reciprocal of $n_j$ when $n_j$ mod n, and $m_i^{-1}$ and $n_j^{-1}$ are derived from the following formulas respectively:

$$(m_i m_i^{-1})\bmod m=1$$

$$(n_j n_j^{-1})\bmod n=1$$

and $\tilde{n}_I$, $\tilde{n}_J$, and $n_q$ are derived from the following formulas respectively:

$$\tilde{n}_I=(m_J n_I)\bmod n$$

$$\tilde{n}_J=(m_J n_I+n_J)\bmod n$$

$$n_q=(m\times(n-n_I))\bmod n;$$

The deinterleaving unit further includes the following subunit:

A second modulo subunit configured to compare data on both sides of the mod, if the left hand side operand is greater than or equal to the right hand side operand, then the right hand side operand is subtracted from the left hand side operand, the modulo result take the difference as result; if the left hand side operand is less than the right hand side operand, the modulo result takes the left hand side operand as result.

A second outputting unit configured to output a deinterleaved permutation matrix.

Figure 13:
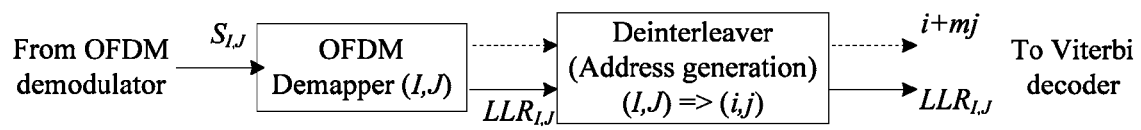
FIG. 13 illustrates a work flow chart of a deinterleaver in practical application according to the forth embodiment of the present invention.

Preferably, FIG. 13 is a work flow chart of a deinterleaver in practical application in this embodiment. Dashed lines represent a generating process of bit write address (i, j) and solid lines represent a process of demodulating soft-decision log-likelihood ratio (LLR) data in the figure. The position coordinate (i, j) in the original permutation matrix of the data corresponding to $S_{IJ}$ is computed by an interleaver address generation unit when the $J^{th}$ subcarrier symbol $S_{IJ}$ of the $I^{th}$ OFDM symbol is processed by a demapper unit of the OFDM demodulator, and $LLR_{IJ}$ is written into the position (i+mj) of the output sequence by the storage unit of the deinterleaver; a Viterbi decoding operation can be performed when data of the whole interleaving block have been modulated and deinterleaved.

The second embodiment is the method embodiment corresponding to this embodiment, this embodiment and the second embodiment can be implemented in cooperation with each other. Correlated technical details disclosed in the second embodiment are still effective in this embodiment and will not be repeated here in order to reduce duplication. Correspondingly, correlated technical details disclosed in this embodiment can also be applied in the second embodiment.

The fifth embodiment of the present invention relates to a data transmitting method for Orthogonal Frequency Division Multiplexing communication equipments. The data transmitting method for Orthogonal Frequency Division Multiplexing communication equipments includes the following data block interleaving steps:

Firstly, obtaining an original permutation matrix before the permutation matrix is interleaved.

Secondly, interleaving the original permutation matrix, wherein, the relationship between a position coordinate (i, j) of any one bit in the original permutation matrix and a position coordinate (I, J) of the bit in the interleaved permutation matrix is:

if I=0, then $$i(0, J) = (i(m-1, J-1) + m_J) \bmod m$$

$$j(0, J) = \begin{cases} (j(m-1, J-1) + \tilde{n}_J + n_q) \bmod n, & \text{if } i(m-1, J-1) + m_J \geq m \\ (j(m-1, J-1) + \tilde{n}_J) \bmod n, & \text{if } i(m-1, J-1) + m_J < m, \end{cases}$$

if I≠0, then $$i(I, J) = (i(I-1, J) + m_I) \bmod m,$$

$$j(I, J) = \begin{cases} (j(I-1, J-1) + \tilde{n}_I + n_q) \bmod n, & \text{if } i(I-1, J) + m_I \geq m \\ (j(I-1, J-1) + \tilde{n}_I) \bmod n, & \text{if } i(I-1, J) + m_I < m, \end{cases}$$

where, i(I, J) is a row coordinate in the original permutation matrix of the bit that has a position coordinate (I, J) in the interleaved permutation matrix, j(I, J) is a column coordinate in the original permutation matrix of the bit that has a position coordinate (I, J) in the interleaved permutation matrix, i(0, J) indicates a row coordinate in the original permutation matrix of the bit that has a position coordinate (0, J) in the interleaved permutation matrix, j(0, J) indicates a column coordinate in the original permutation matrix of the bit that has a position coordinate (0, J) in the interleaved permutation matrix, i=0, 1, . . . , m−1, j=0, 1, . . . , n−1, I=0, 1, . . . , m−1, J=0, 1, . . . , n−1; i(M−1, J−1) and j(m−1, J−1) indicate the row and column coordinates respectively in the original permutation matrix of the bit that has a position coordinate (m−1, J−1) in the interleaved permutation matrix, i(I−1, J) indicates a row coordinate in the original permutation matrix of the bit that has a position coordinate (I−1, J) in the interleaved permutation matrix, j(I−1, J−1) indicates a column coordinate in the original permutation matrix of the bit that has a position coordinate (I−1, J−1) in the interleaved permutation matrix, these four coordinates are known when interleaving the bit that has a position coordinate (I, J) in the interleaved permutation matrix; m and n are the number of columns and the number of rows of the original permutation matrix respectively, mod indicates a modulo operation, and $m_J$, $n_I$ and $n_J$ are derived from the following formulas:

$$m_I = m_i^{-1} \bmod m$$

$$m_J = ((m - m_j) \times m_I) \bmod m$$

$$n_I = ((n - n_j) \times n_J) \bmod n$$

$$n_J = n_j^{-1} \bmod n$$

where, $m_i$ and $m_j$ are designated positive integers which are relatively prime with m, $n_j$ is a designated positive integer which is relatively prime with n, $m_i^{-1}$ is the reciprocal of $m_i$ when $m_i \bmod m$, $n_j^{-1}$ is the reciprocal of $n_j$ when $n_j \bmod n$, and $m_i^{-1}$ and $n_j^{-1}$ are derived from the following formulas respectively:

$$(m_i m_i^{-1}) \bmod m = 1$$

$$(n_j n_j^{-1}) \bmod n = 1$$

and $\tilde{n}_I$, $\tilde{n}_J$ and $n_q$ are derived from the following formulas respectively:

$$\tilde{n}_I = (m_I n_I) \bmod n$$

$$\tilde{n}_J = (m_I n_I + n_J) \bmod n$$

$$n_q = (m \times (n - n_I)) \bmod n;$$

Lastly, outputting an interleaved permutation matrix.

The sixth embodiment of the present invention relates to a data receiving method for Orthogonal Frequency Division Multiplexing communication equipments. The data receiving method for Orthogonal Frequency Division Multiplexing communication equipments includes the following data block deinterleaving steps:

Firstly, obtaining an interleaved permutation matrix.

Secondly, deinterleaving the interleaved permutation matrix, wherein, the relationship between a position coordinate (I, J) of any one bit in the interleaved permutation matrix and a position coordinate (i', j') of the bit in the deinterleaved permutation matrix is:

if I=0, then $$i'(0, J) = (i'(m-1, J-1) + m_J) \bmod m$$

$$j'(0, J) = \begin{cases} (j'(m-1, J-1) + \tilde{n}_J + n_q) \bmod n, & \text{if } i'(m-1, J-1) + m_J \geq m \\ (j'(m-1, J-1) + \tilde{n}_J) \bmod n, & \text{if } i'(m-1, J-1) + m_J < m, \end{cases}$$

if I≠0, then $$i'(I, J) = (i'(I-1, J) + m_I) \bmod m,$$

$$j'(I, J) = \begin{cases} (j'(I-1, J-1) + \tilde{n}_I + n_q) \bmod n, & \text{if } i'(I-1, J) + m_I \geq m \\ (j'(I-1, J-1) + \tilde{n}_I) \bmod n, & \text{if } i'(I-1, J) + m_I < m, \end{cases}$$

where, i'(I, J) is a row coordinate in the deinterleaved permutation matrix of the bit that has a position coordinate (I, J) in the interleaved permutation matrix, j'(I, J) is a column coordinate in the deinterleaved permutation matrix of the bit that has a position coordinate (I, J) in the interleaved permutation matrix, i'(0, J) indicates a row coordinate in the deinterleaved permutation matrix of the bit that has a position coordinate (0, J) in the interleaved permutation matrix, j'(0, J) indicates a column coordinate in the deinterleaved permutation matrix of the bit that has a position coordinate (0, J) in the interleaved permutation matrix, i'=0, 1, ..., m−1, j'=0, 1, ..., n−1, I=0, 1, ..., m−1, J=0, 1, ..., n−1; i' (m−1, J−1) and j'(m−1, J−1) indicate a row coordinate and a column coordinate in the deinterleaved permutation matrix of the bit that has a position coordinate (m−1, J−1) in the interleaved permutation matrix respectively, i'(I−1, J) indicates a row coordinate in the deinterleaved permutation matrix of the bit that has a position coordinate (I−1, J) in the interleaved permutation matrix, j'(I−1, J−1) indicates a column coordinate in the deinterleaved permutation matrix of the bit that has a position coordinate (I−1, J−1) in the interleaved permutation matrix, these four coordinates are known when deinterleaving the bit that has a position coordinate (I, J) in the interleaved permutation matrix; m and n are the number of columns and the number of rows of the original permutation matrix respectively, mod indicates a modulo operation, and $m_I$, $m_J$, $n_I$ and $n_J$ are derived from the following formulas:

$$m_I = m_{i'}^{-1} \bmod m$$

$$m_J = ((m - m_{j'}) \times m_I) \bmod m$$

$$n_I = ((n - n_{j'}) \times n_J) \bmod n$$

$$n_J = n_{j'}^{-1} \bmod n$$

where, $m_{i'}$ and $m_{j'}$ are designated positive integers which are relatively prime with m, $n_{j'}$ is a designated positive integer which is relatively prime with n, $m_i^{-1}$ is the reciprocal of m, when m, mod m, $n_j^{-1}$ is the reciprocal of $n_j$ when $n_j$ mod n, and $m_i^{-1}$ and $n_j^{-1}$ are derived from the following formulas respectively:

$$(m_i m_i^{-1}) \bmod m = 1$$

$$(n_j n_j^{-1}) \bmod n = 1$$

and $\tilde{n}_I$, $\tilde{n}_J$, and $n_q$ are derived from the following formulas respectively:

$$\tilde{n}_I = (m_I n_I) \bmod n$$

$$\tilde{n}_J = (m_I n_I + n_J) \bmod n$$

$$n_q = (m \times (n - n_I)) \bmod n;$$

Lastly, outputting a deinterleaved permutation matrix.

By expressing the interleaving process into two recursive stages, the interleaving and deinterleaving methods of the present invention provide the following features:

a) Support basic interleaving and deinterleaving functionalities of both ITU G.9902 and G.9903 (G3-PLC) standards and integrate them as a DMA (Direct Memory Access) thread;

b) Support all repetition codes for G.9902 and RC4 (ROBO, robust) mode of G.9903 (G3-PLC);

c) Support interleaving/deinterleaving function for high-order constellation (QPSK and 16QAM) for G.9902;

d) In transmitter direction, encoded bits from convolutional encoder are not packed but the interleaved bits are packed into constellation words (2 bits for QPSK, 4 bits for 16QAM) for easy constellation mapping;

e) In receiver direction, soft-decision log-likelihood ratios (LLR) from the demapper are not packed and kept as 8 bits in length. After deinterleaving, the LLRs are kept unpacked (for example, 8 bits). For repetition coded LLRs, the hardware will help sum up all LLRs belonging to the same bit (combining, e.g. averaging or best signal to noise ratio combining), and a Viterbi decoder will take 6 bits out of LLR words (8bits) as a decoding input.

It should be illustrated that units disclosed in the apparatus embodiments of the present invention are logic units. A logic unit can be physically a physical unit, or a portion of a physical unit, or can be implemented in combination of several physical units. The physical implementing ways for these logic units are not the most important, instead, the combination of the functions achieved by these logic units is the key to solving technical problems disclosed in this invention. In addition, for highlighting creative portion of the present invention, units that are not closely relating to solving the technical problem disclosed in this invention are not introduced in above apparatus embodiments of the present invention, which does not mean that there are no other units included in above apparatus embodiments.

It should be illustrated that relationship terms, e.g. first and second etc, are only used to distinguish one substance or operation from another substance or operation in claims and description of the present invention, rather than require or suggest that there are any practical relationships or orders must exist between these substances or operations. Moreover, terms "including", "containing" or any other variant mean to include non-exclusive containing, so that processes, methods, objects or apparatus including a series of elements include not only these elements but also other elements that are not clearly shown or inherent elements of these processes, methods, objects or apparatus. If there are no more limitation, for elements limited by word "including a", other same elements in processes, methods, objects or apparatus containing the element are not excluded.

Although the present invention has been illustrated and described by referring to some preferred embodiments of the present invention, it should be understood to those who skilled in the art that various other changes in the forms and details made on it will not depart from the principles and scope of the invention.

What claimed is:

1. A data block interleaving method for a transmitter in communication equipment, wherein the method includes the following steps:

obtaining by the transmitter an original permutation matrix before the permutation matrix is interleaved;

interleaving by the transmitter the original permutation matrix, wherein, the relationship between a position coordinate (i, j) of any one bit in the original permutation matrix and a position coordinate (I, J) of the bit in the interleaved permutation matrix is:

if I=0, then $$i(0, J) = (i(m-1, J-1) + m_J) \bmod m$$

$$j(0, J) = \begin{cases} (j(m-1, J-1) + \tilde{n}_J + n_q) \bmod n, & \text{if } i(m-1, J-1) + m_J \geq m \\ (j(m-1, J-1) + \tilde{n}_J) \bmod n, & \text{if } i(m-1, J-1) + m_J < m, \end{cases}$$

if I≠0, then $$i(I, J) = (i(I-1, J) + m_I) \bmod m,$$

-continued $$j(I, J) = \begin{cases} (j(I-1, J-1) + \tilde{n}_I + n_q) \bmod n, & \text{if } i(I-1, J) + m_I \geq m \\ (j(I-1, J-1) + \tilde{n}_I) \bmod n, & \text{if } i(I-1, J) + m_I < m, \end{cases}$$

where, i(I, J) is a row coordinate in the original permutation matrix of the bit that has a position coordinate (I, J) in the interleaved permutation matrix, j(I, J) is a column coordinate in the original permutation matrix of the bit that has a position coordinate (I, J) in the interleaved permutation matrix, i=0, 1, . . . , m−1, j=0, 1, . . . , n−1, I=0, 1, . . . , m−1, J=0, 1, . . . , n−1, m and n are the number of columns and the number of rows of the original permutation matrix respectively, mod indicates a modulo operation, and $m_I$, $m_J$, $n_I$ and $n_J$ are derived from the following formulas:

$$m_I = m_i^{-1} \bmod m$$

$$m_J = ((m - m_j) \times m_I) \bmod m$$

$$n_I = ((n - n_j) \times n_J) \bmod n$$

$$n_J = n_j^{-1} \bmod n$$

where, $m_i$ and $m_j$ are designated positive integers which are relatively prime with m, $n_j$ is a designated positive integer which is relatively prime with n, $m_i^{-1}$ is the reciprocal of $m_i$ when $m_i$ mod m, $n_j^{-1}$ is the reciprocal of $n_j$ when $n_j$ mod n, and $m_i^{-1}$ and $n_j^{-1}$ are derived from the following formulas respectively:

$$(m_i m_i^{-1}) \bmod m = 1$$

$$(n_j n_j^{-1}) \bmod n = 1,$$

and $\tilde{n}_I$, $\tilde{n}_J$ and $n_q$ are derived from the following formulas respectively:

$$\tilde{n}_I = (m_I n_I) \bmod n$$

$$\tilde{n}_J = (m_I n_I + n_J) \bmod n$$

$$n_q = (m \times (n - n_I)) \bmod n;$$

outputting by the transmitter the interleaved permutation matrix.

2. The data block interleaving method according to claim 1, wherein the modulo operation is implemented as follows: the left hand side operand of the mod operator is compared with the right hand side operand, if the left hand side operand is greater than or equal to the right hand side operand, then the right hand side operand is subtracted from the left hand side operand, and the obtained difference is taken as the result of the modulo operation; if the left hand side operand is less than the left hand side operand, then the left hand side operand is taken as the result of the modulo operation.

3. The data block interleaving method according to claim 1, wherein the data block includes n OFDM symbols, each OFDM symbol includes m subcarriers.

4. The data block interleaving method according to claim 1, wherein the data block interleaving method is used in ITU G.9902, ITU G.9903, IEEE P1901.2 or G3-PLC FEC standards.

5. A data block deinterleaving method for a receiver in communication equipment, wherein the method includes the following steps:
obtaining by the receiver an interleaved permutation matrix;
deinterleaving by the receiver the interleaved permutation matrix, wherein, the relationship between a position coordinate (I, J) of any one bit in the interleaved permutation matrix and a position coordinate (i', j') of the bit in the deinterleaved permutation matrix is:
if I=0, then $$i'(0, J) = (i'(m-1, J-1) + m_J) \bmod m$$

$$j'(0, J) = \begin{cases} (j'(m-1, J-1) + \tilde{n}_J + n_q) \bmod n, & \text{if } i'(m-1, J-1) + m_J \geq m \\ (j'(m-1, J-1) + \tilde{n}_J) \bmod n, & \text{if } i'(m-1, J-1) + m_J < m, \end{cases}$$

if I≠0, then $$i'(I, J) = (i'(I-1, J) + m_I) \bmod m,$$

$$j'(I, J) = \begin{cases} (j'(I-1, J-1) + \tilde{n}_I + n_q) \bmod n, & \text{if } i'(I-1, J) + m_I \geq m \\ (j'(I-1, J-1) + \tilde{n}_I) \bmod n, & \text{if } i'(I-1, J) + m_I < m, \end{cases}$$

where, i'(I, J) is a row coordinate in the deinterleaved permutation matrix of the bit that has a position coordinate (I, J) in the interleaved permutation matrix, j'(I, J) is a column coordinate in the deinterleaved permutation matrix of the bit that has a position coordinate (I, J) in the interleaved permutation matrix, i'=0, 1, . . . , m−1, j'=0, 1, . . . , n−1, I=0, 1, . . . , m−1, J=0, 1, . . . , n−1, m and n are the number of columns and the number of rows of the original permutation matrix respectively, mod indicates a modulo operation, and $m_I$, $m_J$, $n_I$ and $n_J$ are derived from the following formulas:

$$m_I = m_{i'}^{-1} \bmod m$$

$$m_J = ((m - m_{j'}) \times m_I) \bmod m$$

$$n_I = ((n - n_{j'}) \times n_J) \bmod n$$

$$n_J = n_{j'}^{-1} \bmod n$$

where, $m_{i'}$ and $m_{j'}$ are designated positive integers which are relatively prime with m, $n_{j'}$ is a designated positive integer which is relatively prime with n, $m_i^{-1}$ is the reciprocal of $m_i$ when $m_i$ mod m, $n_j^{-1}$ is the reciprocal of $n_j$ when $n_j$ mod n, and $m_i^{-1}$ and $n_j^{-1}$ are selected by the following formulas respectively:

$$(m_i m_i^{-1}) \bmod m = 1$$

$$(n_j n_j^{-1}) \bmod n = 1,$$

and $\tilde{n}_I$, $\tilde{n}_J$ and $n_q$ are selected by the following formulas respectively:

$$\tilde{n}_I = (m_I n_I) \bmod n$$

$$\tilde{n}_J = (m_I n_I + n_J) \bmod n$$

$$n_q = (m \times (n - n_I)) \bmod n;$$

outputting by the receiver the deinterleaved permutation matrix.

6. The data block deinterleaving method according to claim 5, wherein the modulo operation is implemented as follows:
the left hand side operand of the mod operator is compared with the right hand side operand, if the left hand side operand is greater than or equal to the right hand side operand, then the right hand side operand is subtracted from the left hand side operand, the modulo result take the difference as result; if the left hand side operand is less than the right hand side operand, the modulo result takes the left hand side operand as result.

7. The data block deinterleaving method according to claim 5, wherein the data block includes n OFDM symbols, each OFDM symbol includes m subcarriers.

8. The data block deinterleaving method according to claim 5, wherein the data block deinterleaving method is used in ITU G.9902, ITU G.9903, IEEE P1901.2 or G3-PLC FEC standards.

9. A data block interleaving apparatus for communication equipment, wherein the apparatus includes the following units:
a first obtaining unit configured to obtain an original permutation matrix before the permutation matrix is interleaved;
an interleaving unit configured to interleave the original permutation matrix, wherein, the relationship between a position coordinate (i, j) of any one bit in the original permutation matrix and a position coordinate (I, J) of the bit in the interleaved permutation matrix is:
if I=0, then $$i(0, J) = (i(m-1, J-1) + m_J) \bmod m$$

$$j(0, J) = \begin{cases} (j(m-1, J-1) + \tilde{n}_J + n_q) \bmod n, & \text{if } i(m-1, J-1) + m_J \geq m \\ (j(m-1, J-1) + \tilde{n}_J) \bmod n, & \text{if } i(m-1, J-1) + m_J < m, \end{cases}$$

if I≠0, then $$i(I, J) = (i(I-1, J) + m_I) \bmod m,$$

$$j(I, J) = \begin{cases} (j(I-1, J-1) + \tilde{n}_I + n_q) \bmod n, & \text{if } i(I-1, J) + m_I \geq m \\ (j(I-1, J-1) + \tilde{n}_I) \bmod n, & \text{if } i(I-1, J) + m_I < m, \end{cases}$$

where, i(I, J) is a row coordinate in the original permutation matrix of the bit that has a position coordinate (I, J) in the interleaved permutation matrix, Λ(I, J) is a column coordinate in the original permutation matrix of the bit that has a position coordinate (I, J) in the interleaved permutation matrix, i=0, 1, . . . , m−1, j=0, 1, . . . , n−1, I=0, 1, . . . , m−1, J=0, 1, . . . , n−1, m and n are the number of columns and the number of rows of the original permutation matrix respectively, mod indicates a modulo operation,
and $m_I$, $m_J$, $n_I$ and $n_J$ are derived from the following formulas:

$$m_I = m_i^{-1} \bmod m$$

$$m_J = ((m - m_j) \times m_I) \bmod m$$

$$n_I = ((n - n_j) \times n_J) \bmod n$$

$$n_J = n_j^{-1} \bmod n$$

where, $m_i$ and $m_j$ are designated positive integers which are relatively prime with m, $n_j$ is a designated positive integer which is relatively prime with n, $m_i^{-1}$ is the reciprocal of $m_i$ when $m_i$ mod m, $n_j^{-1}$ is the reciprocal of $n_j$ when $n_j$ mod n, and $m_i^{-1}$ and $n_j^{-1}$ are derived from the following formulas respectively:

$$(m_i m_i^{-1}) \bmod m = 1$$

$$(n_j n_j^{-1}) \bmod n = 1,$$

and $\tilde{n}_I$, $\tilde{n}_J$ and $n_q$ are derived from the following formulas respectively:

$$\tilde{n}_I = (m_I n_I) \bmod n$$

$$\tilde{n}_J = (m_J n_I + n_J) \bmod n$$

$$n_q = (m \times (n - n_I)) \bmod n;$$

a first outputting unit configured to output the interleaved permutation matrix.

10. The data block interleaving apparatus according to claim 9, wherein the interleaving unit further includes the following subunit:
a first modulo subunit configured to compare operand on both sides of the mod, if the left hand side operand is greater than or equal to the right hand side operand, then the right hand side operand is subtracted from the left hand side operand, and the obtained difference is taken as the result of the modulo operation; if the left hand side operand is less than the left hand side operand, then the left hand side operand is taken as the result of the modulo operation.

11. A data block deinterleaving apparatus for communication equipment, wherein the apparatus includes the following units:
a second obtaining unit configured to obtain an interleaved permutation matrix;
a deinterleaving unit configured to deinterleave the interleaved permutation matrix, wherein, the relationship between a position coordinate (I, J) of any one bit in the interleaved permutation matrix and a position coordinate (i', j') of the bit in the deinterleaved permutation matrix is:
if I=0, then $$i'(0, J) = (i'(m-1, J-1) + m_J) \bmod m$$

$$j'(0, J) = \begin{cases} (j'(m-1, J-1) + \tilde{n}_J + n_q) \bmod n, & \text{if } i'(m-1, J-1) + m_J \geq m \\ (j'(m-1, J-1) + \tilde{n}_J) \bmod n, & \text{if } i'(m-1, J-1) + m_J < m, \end{cases}$$

if I≠0, then $$i'(I, J) = (i'(I-1, J) + m_I) \bmod m,$$

$$j'(I, J) = \begin{cases} (j'(I-1, J-1) + \tilde{n}_I + n_q) \bmod n, & \text{if } i'(I-1, J) + m_I \geq m \\ (j'(I-1, J-1) + \tilde{n}_I) \bmod n, & \text{if } i'(I-1, J) + m_I < m, \end{cases}$$

where, i'(I, J) is a row coordinate in the deinterleaved permutation matrix of the bit that has a position coordinate (I, J) in the interleaved permutation matrix, j'(I, J) is a column coordinate in the deinterleaved permutation matrix of the bit that has a position coordinate (I, J) in the interleaved permutation matrix, i'=0, 1, . . . , m−1, j'=0, 1, . . . , n−1, I=0, 1, . . . , m−1, J=0, 1, . . . , n−1, m and n are the number of columns and the number of rows of the original permutation matrix respectively, mod indicates a modulo operation, and $m_I$, $m_J$, $n_I$ and $n_J$ are derived from the following formulas:

$$m_I = m_{i'}^{-1} \bmod m$$

$$m_J = ((m - m_{j'}) \times m_I) \bmod m$$

$$n_I = ((n - n_{j'}) \times n_J) \bmod n$$

$$n_J = n_{j'}^{-1} \bmod n$$

where, $m_{i'}$ and $m_{j'}$ are designated positive integers which are relatively prime with m, $n_{j'}$ is a designated positive integer which is relatively prime with n, $m_i^{-1}$ is the reciprocal of $m_i$ when $m_i \bmod m$, $n_j^{-1}$ is the reciprocal of $n_j$ when $n_j \bmod n$, and $m_i^{-1}$ and $n_j^{-1}$ are derived from the following formulas respectively:

$$(m_i m_i^{-1}) \bmod m = 1$$

$$(n_j n_j^{-1}) \bmod n = 1,$$

and $\tilde{n}_I$, $\tilde{n}_J$ and $n_q$ are derived from the following formulas respectively:

$$\tilde{n}_I = (m_I n_I) \bmod n$$

$$\tilde{n}_J = (m_I n_I + n_J) \bmod n$$

$$n_q = (m \times (n - n_I)) \bmod n;$$

a second outputting unit configured to output the deinterleaved permutation matrix.

12. The data block deinterleaving apparatus according to claim 11, wherein the deinterleaving unit further includes the following subunit:

a second modulo subunit configured to compare operand on both sides of the mod, if the left hand side operand is greater than or equal to the right hand side operand, then the right hand side operand is subtracted from the left hand side operand, and the obtained difference is taken as the result of the modulo operation; if the left hand side operand is less than the left hand side operand, then the left hand side operand is taken as the result of the modulo operation.

13. A data transmitting method for OFDM communication equipment, wherein the method includes the data block interleaving steps of claim 1.

14. A data receiving method for OFDM communication equipment, wherein the method includes the data block deinterleaving steps of claim 5.

* * * * *